United States Patent [19]

Sengchanh

[11] Patent Number: 4,620,188
[45] Date of Patent: Oct. 28, 1986

[54] MULTI-LEVEL LOGIC CIRCUIT

[75] Inventor: Chanty Sengchanh, Sandringham, New Zealand

[73] Assignee: Development Finance Corporation of New Zealand, Auckland, New Zealand

[21] Appl. No.: 408,118

[22] Filed: Aug. 13, 1982

[30] Foreign Application Priority Data

Aug. 17, 1981 [NZ] New Zealand .................. 198054

[51] Int. Cl.$^4$ .................. H04Q 1/00; H03K 19/08
[52] U.S. Cl. .................. 340/825.87; 307/465; 364/773
[58] Field of Search .................. 340/825.87, 825.83, 340/347 DD, 825.78, 825.77; 307/465; 364/768, 773

[56] References Cited

U.S. PATENT DOCUMENTS

| | | |
|---|---|---|
| 3,168,722 | 2/1965 | Sanders . |
| 3,204,122 | 8/1965 | Ih . |
| 3,374,470 | 3/1968 | Rohland . |
| 3,417,262 | 12/1968 | Yao . |
| 3,567,957 | 3/1971 | Aten . |
| 3,593,034 | 7/1971 | Omote .................. 307/223 |
| 3,601,626 | 8/1971 | Hoffmann et al. . |
| 3,646,329 | 2/1972 | Yoshino et al. . |
| 3,702,474 | 11/1972 | Fink et al. .................. 340/825.78 |
| 3,855,481 | 12/1974 | DeMone .................. 307/225 |
| 3,900,744 | 8/1975 | Lammers . |
| 3,916,327 | 10/1975 | Lampen et al. . |
| 3,932,714 | 1/1976 | Guimier et al. .................. 340/825.77 |
| 4,140,920 | 2/1979 | Dao et al. .................. 364/773 |
| 4,152,696 | 5/1979 | Smith . |
| 4,205,303 | 5/1980 | Barnhart .................. 364/768 |
| 4,290,111 | 9/1981 | Dillon .................. 364/768 |
| 4,319,225 | 3/1982 | Klose .................. 340/347 DD |
| 4,325,056 | 4/1982 | Weiner .................. 340/347 DD |
| 4,326,136 | 4/1982 | Le Can .................. 307/451 |

OTHER PUBLICATIONS

"The Prospects for Multiple Value Logic: A Technology and Applications View", K. C. Smith, IEEE Transactions on Computers, vol. C-30, #9, Sep. 1981, pp. 619-634.

"Proceedings; The Institution of Electrical Engineers", vol. 121, Electronics, Jun. 1974, pp. 409-418.

Primary Examiner—Donald J. Yusko
Attorney, Agent, or Firm—Young & Thompson

[57] ABSTRACT

A Multi-Level Logic Circuit is described, with the hardware of the circuit capable of being constructed to operate in a chosen base. The circuit includes at least: (a) One input level detector which can receive one or more multi-level inputs, (b) Control switching means, and (c) An output level generator delivering a single multi-level output.

Various logic gates operating in any base can be derived from the generalized circuit of this invention. Basic multi-level logic gates include an (n−1) complementer, where an output of (n−1−a) is generated from a discrete input "a" where n is the base for which the circuit is constructed. A complementary maximum gate is also described in which the circuit provides the (n−1) complement of the highest logic level detected on input lines to the input level detector. Various other multi-level logic circuits can be constructed by combining the multi-level complementer, and multi-level complementary maximum gates. Circuits are also described where there are more than one input level detector or control switching means to provide binary operations on inputs to the multi-level logic circuits, e.g. addition, multiplication, in any desired base. Circuits are illustrated, constructed to operate in base 10.

The multi-level logic circuit is similar to a binary circuit in that it operates on discrete logic levels. It is not an analog circuit.

7 Claims, 21 Drawing Figures

| GATES | DERIVED FROM | SYMBOLS |
|---|---|---|
| COMPLEMENTER | FIG. 9 |  or  |
| $\overline{\text{MAXIMUM}}$ | FIG. 9 with dotted inputs |  or  |
| MAXIMUM |  |  or  |
| MINIMUM |  |  or  |
| $\overline{\text{MINIMUM}}$ | | |

Master | Slave

MULTI-LEVEL LOGIC CIRCUIT

FIELD OF THE INVENTION

This invention relates to a multi-level logic circuit which can be constructed to operate in any desired base to produce a multi-level logic gate which operates directly on a multi-level logic input. It can be applied to the different switching technologies, e.g. fluidic, pneumatic, optical, and electronic circuits. The description concentrates on the digital electronic field as the various multi-level logic gates according to the invention can be readily constructed from a few elementary electronic components currently available.

For ease of understanding, the following glossary defines the abbreviations used throughout the specification:

GLOSSARY

A, B: Multi-level inputs to MLL circuit.
BMC: Basic Memory Cell.
BE: Base-Emitter of a transistor.
Buf: Buffer.
CE: Collector-emitter of a transistor.
CS: Control switching means.
D: Diode switch.
DTrD: Diode transistor diode circuit.
ILD: Input level detector.
LLR: Logic Level Recogniser.
LSD: Least significant digit.
MAX: MAXimum (gate).
MIN: MINimum (gate).
MLL: Multi-level logic.
MSD: Most significant digit.
OLG: Output level generator.
R: a binary operator.
Rb: base resistor of a transistor.
T: Threshold.
Tr: Transistor.
U: Logic Unit.
V: Voltage.
Vbe: Base-emitter junction forward voltage of a bipolar transistor.
Vcc: Supply voltage.
Vf: Forward voltage of a diode.
VZ: Breakdown voltage of a zener diode.
Y: A multi-level output.
Z: Zener-diode.
ZTrZ: Zener transistor zener circuit.

DESCRIPTION OF THE PRIOR ART

Binary logic systems utilizing digital electronics have developed to a high degree of sophistication. However, they suffer from significant disadvantages. The most common prior art approach towards increasing the speed and accuracy of a machine assigned for a complex task involves the use of a binary computer with a wide data word length. This clearly has many limitations. Firstly, there is a large number of total components required. Secondly, there is a large number of interconnections, of pins per integrated circuit chip-and thirdly, the complexity of wiring from chip to chip, module to module, system to system, etc., is expensive.

Attempts have been made to produce "artificial intelligence" in the form of machines using complex software. One such promising approach is the development of software which can implement "fuzzy logic" operations. Binary computers are not adapted to utilize such complex software, as the complex software usually involves a lengthy and slow program to be executed. A great deal of time is required in producing, debugging, and modifying the complex software if it is to be used in a binary machine. Moreover, a binary machine offers no option other than the choice between a "true" and "false" logic.

Attempts have been made to devise systems whereby binary machines can simulate multiple-valued logic systems. One such approach is that of Green and Taylor entitled "Modular Representation of Multiple-Valued Logic Systems", PROC, IEE, vol. 121, no. 6, June 1974, page 409. This involves the use of Galois field structures, and would enable a binary circuit to simulate a multiple-valued logic system, however, the interconnection between such a circuit and a similar binary circuit would create an information bottle-neck if the information is to be transmitted from one circuit to the other in a binary code.

The following U.S. patents illustrate examples of digital to analog converters, digital control circuits, and digital threshold circuits.

U.S. Pat. No. 3,168,722, Sanders, Feb. 2, 1965
U.S. Pat. No. 3,204,122, Ih, Aug. 31, 1965
U.S. Pat. No. 3,374,470, Rohland, Mar. 19, 1968
U.S. Pat. No. 3,417,262, Yao, Dec. 17, 1968
U.S. Pat. No. 3,567,957, Aten, Mar. 2, 1971
U.S. Pat. No. 3,601,626, Hoffmann et al., Aug. 24, 1971
U.S. Pat. No. 3,646,329, Yoshino et al., Feb. 29, 1972
U.S. Pat. No. 3,900,744, Lammers, Aug. 19, 1975
U.S. Pat. No. 3,916,327, Lampen et al., Oct. 28, 1975
U.S. Pat. No. 4,152,696, Smith, May 1, 1979
U.S. Pat. No. 4,326,136, LeCan et al., Apr. 20, 1982

Of particular interest in U.S. Pat. No. 4,152,696 which is concerned with compressing information on a transmission line to a control circuit used to switch a variety of relays. This uses a variety of zener-diodes to detect different input signals, and when a particular input signal is received, its associated zener-diode is used to switch a transistor switching circuit which in turn activates a relay to enable an appropriate control function. Thus the output from this control circuit is a plurality of discrete binary outputs.

U.S. Pat. No. 4,326,136 teaches a threshold circuit which may include a plurality of thresholds and is implemented by means including input-level-dependent switching transistors.

U.S. Pat. No. 3,916,327 teaches an output circuit for a voltage divider device in which an input voltage is coupled to an eight-bit up-down counter to produce a representative digital value, said digital representation being then converted to an output voltage by means of a digital-to-analog converter.

None of these patents teach the construction of a multi-level logic circuit, although with hindsight it will be noted that parts of some of these circuits have some similarity to parts of the circuits of this invention.

SUMMARY OF THE INVENTION

It is an object of this invention to provide a "true" multi-level logic circuit which can operate on a multi-level logic input to provide a multi-level logic output. In referring to a multi-level logic input or output, reference is made to a logic signal operating in a base n, where n is greater than 2.

In one aspect, the invention provides a multi-level logic circuit which includes at least: (a) one input level detector (ILD) which can receive one or more multi-level inputs, (b) control switching means (CS), and (c) an output level generator (OLG) delivering a single multi-level output.

This generalized circuit can be used to construct basic building blocks for the operation of multi-level logic machines. Basic gates include an (n−1) complementer, and a complementary maximum gate. These two basic gates can be used to construct various other multi-level logic gates and circuits including a basic latch or basic memory cell, flip-flops, and registers in base n. In addition to circuits constructed from these basic gates, more complex multi-level logic circuits can be constructed for arithmetic or binary operations on multi-level inputs, as well as interface circuits enabling the multi-level logic circuits to interface with existing binary circuits or systems.

By enabling circuits to be constructed to operate in any desired base, the invention enables machines to be constructed of much greater speed, "intelligence," and memory capability than those operating on binary digital electronics. For example, by constructing a machine operating in base 10, having, say, 16 address lines and 8 data lines, then a central processing unit operating in base 10 would be able to address $10^{16}$ different memory locations with an information coding of $10^8$, which is far greater than the present information coding capability of $2^8$. With this increased information coding capability, the entire vocabulary of one language could be coded, enabling a machine to recognize and operate on a natural language. In addition, the ability to operate using multi-level inputs enables the machine to accept and operate in software embodying "fuzzy logic" enabling the construction of "artificial intelligences" simulating human thinking.

BRIEF DESCRIPTION OF THE FIGURES

Other aspects of this invention which should be considered in all its novel aspects, will become apparent from the following description, which is given by way of example only, with reference to the accompanying drawings, in which.

DETAILED DESCRIPTION

The multi-level logic circuit of base n (where n is greater than 2) includes at least one ILD, at least one CS, and at least one OLG. An ILD is a network whose function is to detect an appropriate logic level presented at its input and to provide a signal to the CS. The CS, in turn, is a switching network whose function is to respond to the ILD signal and to select a corresponding logic level from an OLG. The latter is a network which provides an appropriate output logic level when this is selected.

More particularly the ILD is a set of input parameter dependent switches or switching network capable of enabling/disabling the CS. An ILD can be chosen to detect any desired parameter, e.g. temperature, pressure, luminosity, frequency, current, voltage or the like. The CS is a set of switches which can be used to enable/disable an output logic level from the OLG. The OLG is a parameter level determiner which can be formed by arranging the output parameter level generators in series, in parallel, or in a matrix to provide a multi-level output.

Different types of multi-level logic circuits can be constructed depending upon the interaction of the ILD, CS, and OLG components. Three main types of circuits have been developed using these components and these are described as type 1, type 2, and type 3 circuits. Other combinations are possible.

The circuits of this invention can be constructed to operate in any chosen base greater than 2. The block diagrams are intended to represent the general concept of base n (n>2) circuits.

Figure 1:
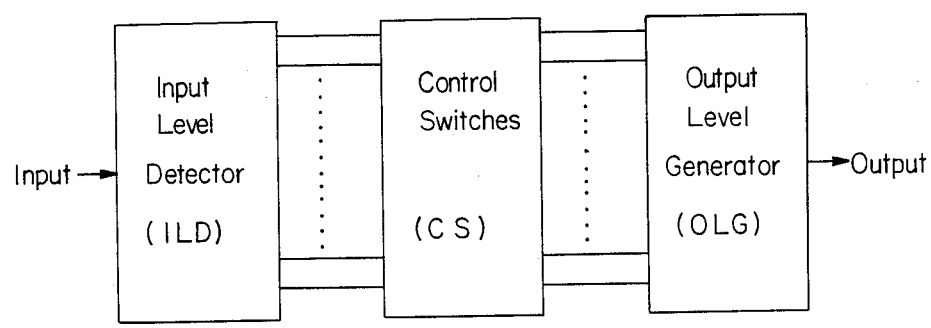
FIG. 1 illustrates a type 1 multi-level logic circuit.

Type 1 A type one circuit is 1 containing a single ILD, a single CS, and a single OLG. The block diagram of such a circuit is illustrated in FIG. 1.

Figure 2:
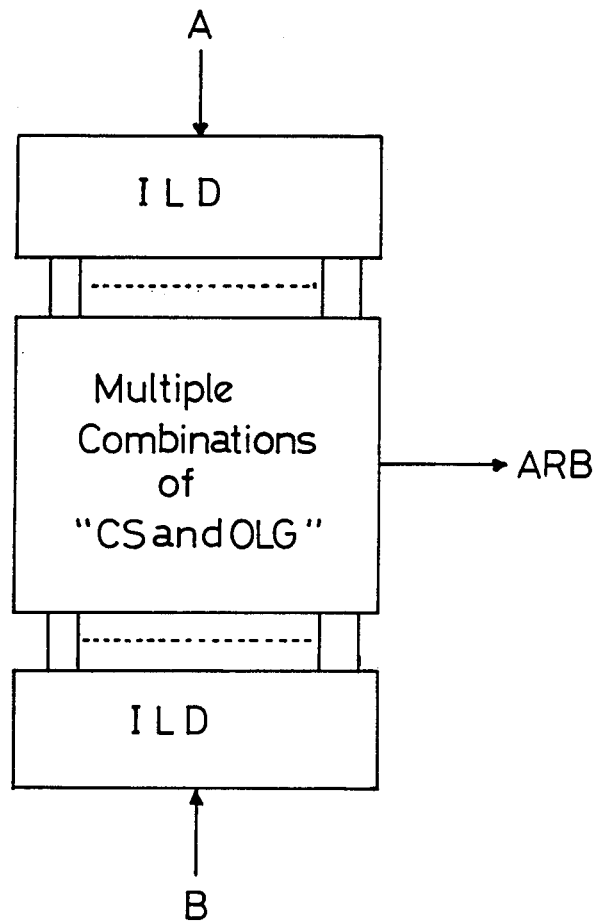
FIG. 2 illustrates a type 2 multi-level logic circuit.

Type 2 A type 2 circuit is one having two ILDs and a multiple combination of "CS and OLG". The block diagram of such a circuit is shown in FIG. 2. It has inputs A and B and can provide an output ARB in which R represents a binary relationship between the multi-level inputs A and B.

Figure 3:
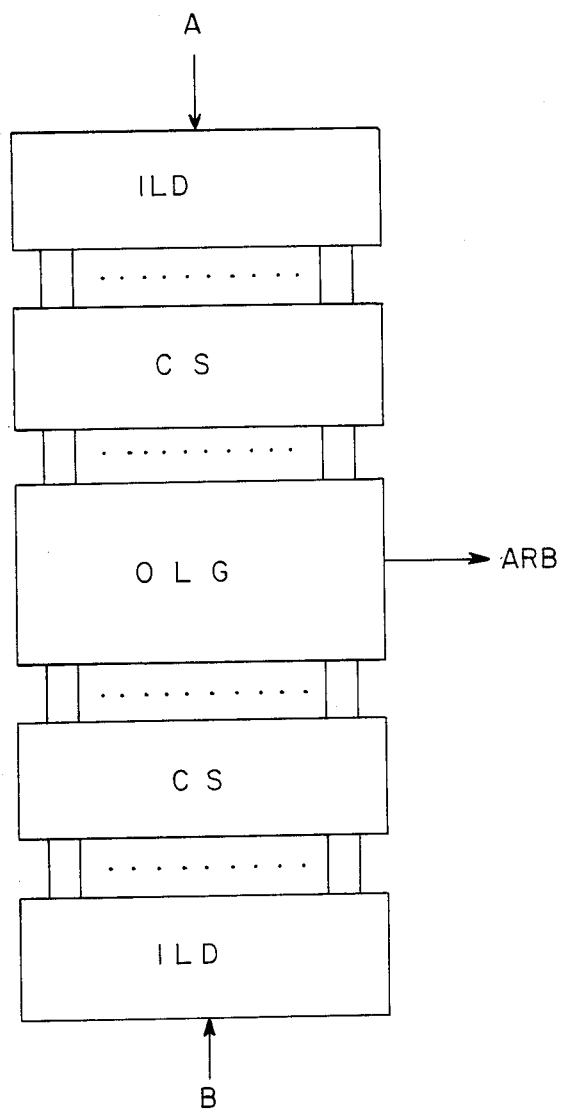
FIG. 3 illustrates a type 3 multi-level logic circuit.

Type 3 A type 3 circuit is one having two ILDs, two CSs and one OLG. The block diagram of such a circuit is shown in FIG. 3. This is also capable of providing a binary operation on multi-level inputs A and B.

Figure 4:
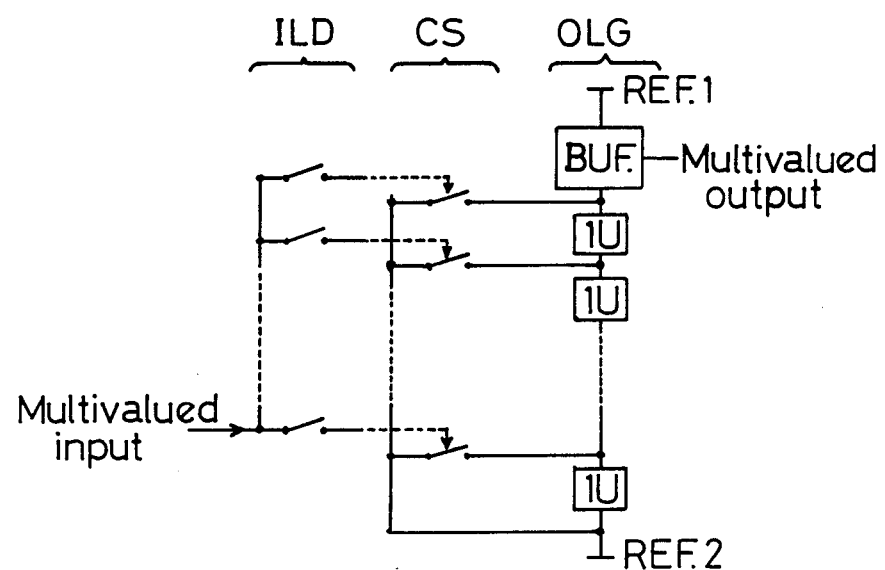
FIG. 4 illustrates a type 1 multi-level logic circuit wherein the output level generator is a series of output parameter generators.
Figure 5:
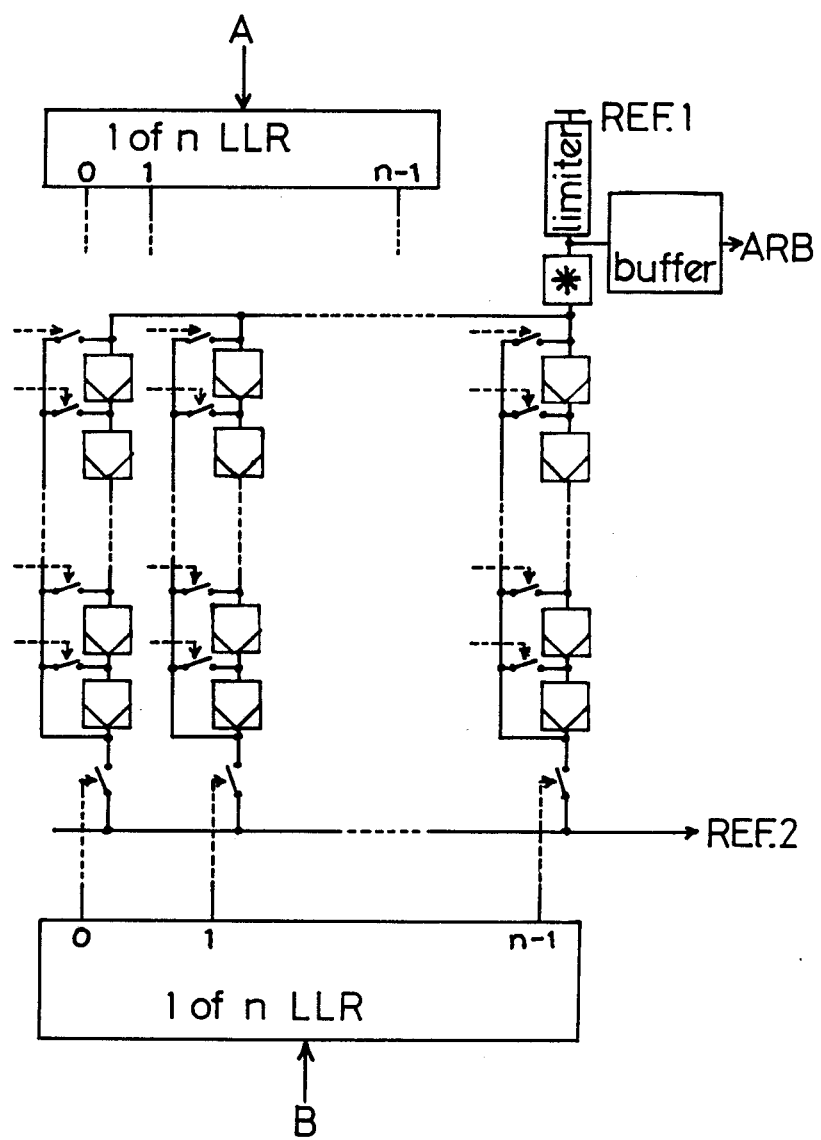
FIG. 5 illustrates a type 2 circuit wherein the output level generator includes a series of output parameter generators.
Figure 6:
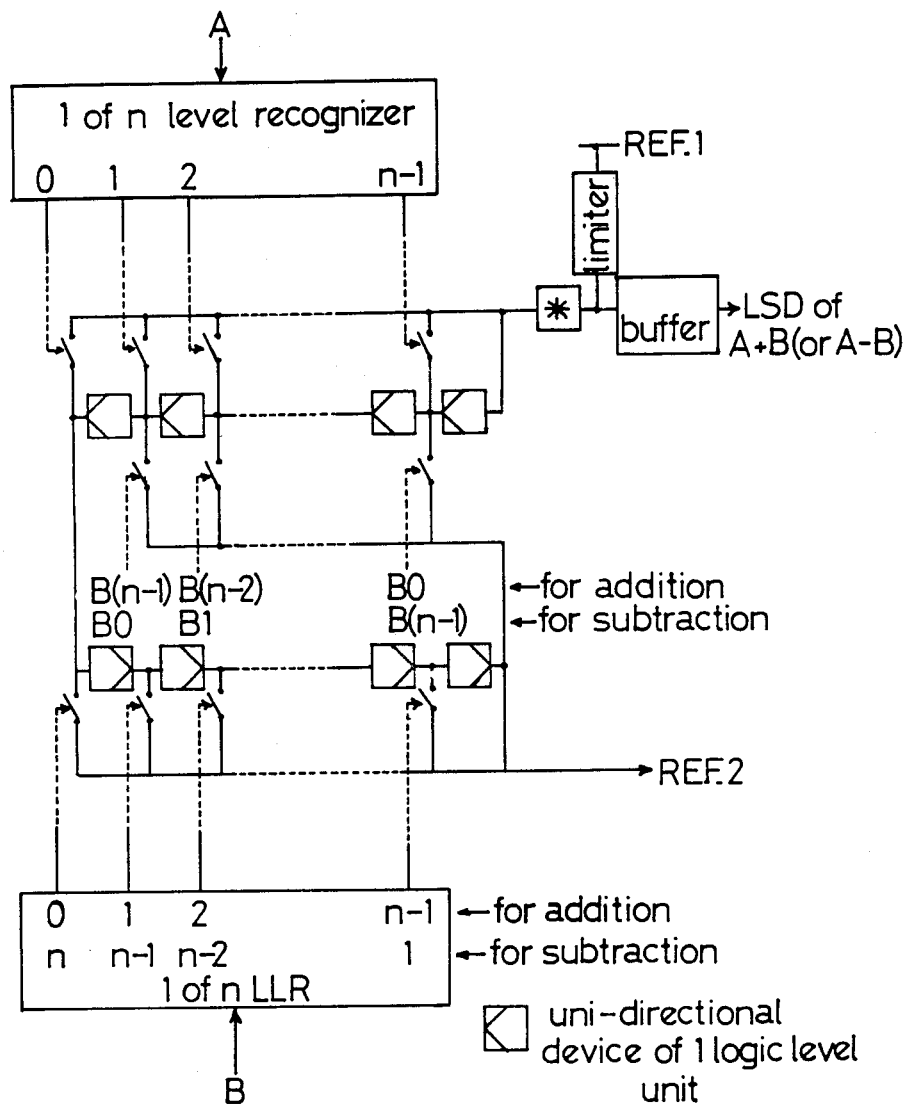
FIG. 6 illustrates a type 3 circuit wherein the output level generator includes a series of output parameter generators.

One of many possible circuit structures implementing a multi-level logic (MLL) circuit of types 1,2 and 3 are shown respectively in FIGS. 4, 5 and 6, where it should be noted that:

(i) Each switch shown represents either a single switch or a combination network of multiple switches, (ii) A "switch" means any device which is capable of being turned ON/OFF (e.g. a thermocouple, a hydraulic valve, a transistor, etc.)

Figure 7:
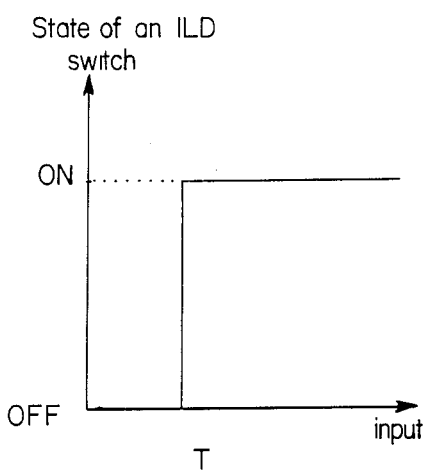
FIG. 7A shows a "step function" characteristic of an input level detector switch.
FIG. 7B illustrates a "rectangular window" characteristic of an input level detector switch.
Figure 7:
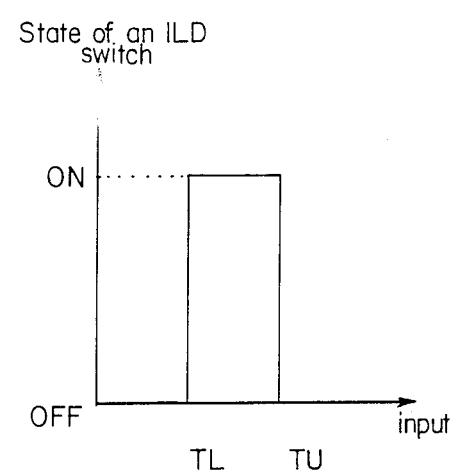

(iii) Each ILD switch may possess one of the following characteristics:
   a "step function" as shown in FIG. 7(a), (where T on input axis means "threshold"),
   a "rectangular window" as shown in FIG. 7(b), (where TU means "upper threshold", and TL means "Lower threshold").

(iv) Each OLG is formed by a series of the output parameter level generators.

(v) The general circuit of FIG. 4 shows a series of switches forming the ILD. These switches are separated by a vertical broken line indicating that there may be any number of switches making up the ILD. As the circuit operates in base n, there will be (n−1) switches in the ILD and correspondingly (n−1) elements making up the CS and (n−1) elements each of 1 logic unit designated (1U) making up the OLG. As FIG. 4 shows 3 switches in the ILD, this generalized circuit would operate in base 5 if no other elements were included along the broken lines.

Hereafter, any OLD possessing a "rectangular window" will be referred to as "1 of n logic level recogniser "or" 1 of n LLR".

ELECTRONIC CIRCUIT IMPLEMENTATION

Hereafter, the invention will be concerned with some digital electronic multi-level logic gates, circuits, etc. whose input and output variables are discrete voltage values.

TYPE 1 MLL GATES

Following from the general circuit structure shown in FIG. 4, some actual electronic circuits realizing the basic multi-level logic gate will now be described.

DIODE-TRANSISTOR-DIODE (DTD) CIRCUIT

Figure 8:
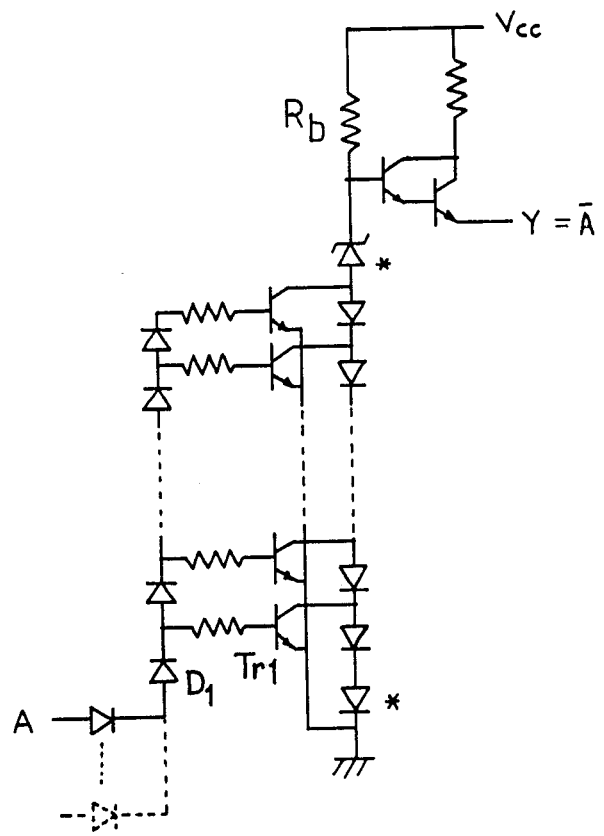
FIG. 8 illustrates a type 1 circuit using diodes, transistors and diodes.
Figure 10B:
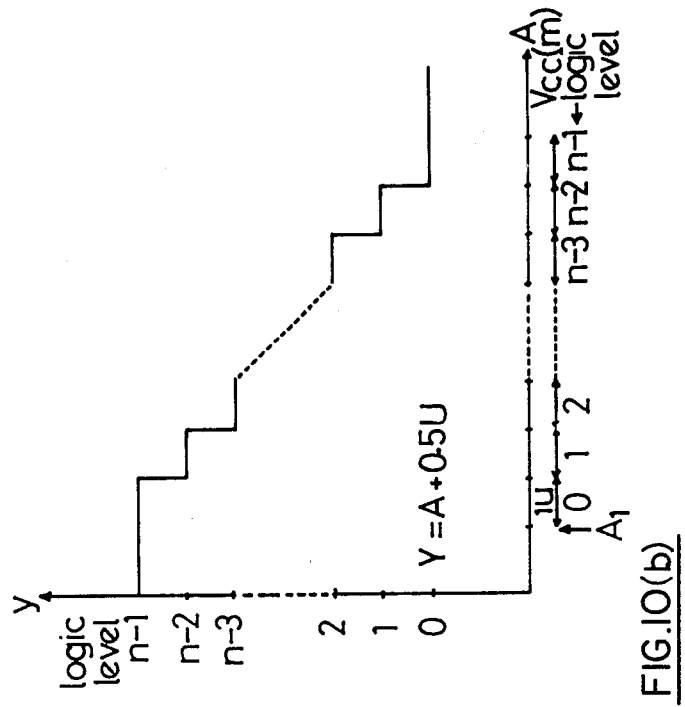
FIG. 10B shows the characteristic logic functions of the circuits of FIG. 8 or 9.
Figure 10A:
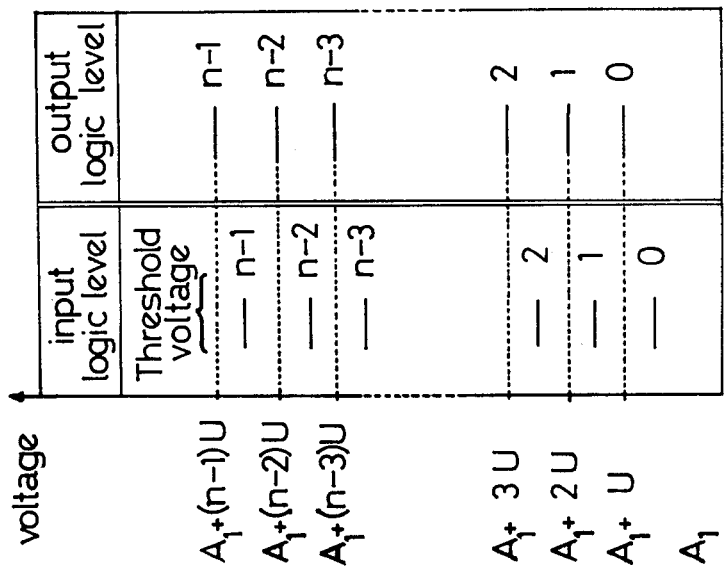
FIG. 10A illustrates the various logic levels of the circuits of FIG. 8 or 9.

A DTRD circuit implementing a basic MLL gate is shown in FIG. 8. Its functional parts can be identified as follows:

(a) the ILD is a set of the "D-$R_b$-BE in series",
(b) the CS is a set of the "CE switches", and
(e) that OLG is formed by the series of diodes at the right of FIG. 8 where
   D=diode switch
   $R_b$=base resistor of the transistor
   BE=base-emitter,
   CE=collector-emitter Its logic levels are defined as shown in FIG. 10(a), where, in this case, $$A_1 = V_f \text{ of diode} + V_{be\,(sat)} \text{ of Transistor}$$
$$= \text{say } 1.4 \text{ V}$$
$$U = \text{logic unit} = V_f \text{ of diode} = \text{say } 0.7 \text{ V}$$

Its characteristic function is shown in FIG. 10(b). The DTD gate whose circuit is shown in FIG. 4 is thus an "(n−1) complementer" gate or an "inverter in base n" gate.

For example, if the input voltage $V_{in}$ applied to A is less than 1.4 V, i.e. A is at logic 0, then the output voltage $V_{out}$ will be at $[(n-1)\times0.7+1.4]$ volts, i.e. Y is at logic (n−1).

Now if $V_{in}$ is say about $(1.4+1\times(0.7/2))$ volts, i.e. A is at logic 1, then the input diode $D_1$ will conduct and TrI will be turned ON. This causes the diode at the bottom of the output voltage divider to be shorted to ground, leaving $V_{out}$ (n−2)×0.7+1.4 volts OR Y is at logic (n−2)

Generally, if $V_{in}$=say $(1.4+K\times(0.7/2))$ volts, i.e. A is at logic K, then the input diodes $D_1, \ldots, D_k$ conduct, and Trk will be turned "ON" and short K output diodes to ground, leaving $V_{out}=(n-1-k)\times0.7+1.4$ V, i.e. Y is at logic (n−1−k).

It is thus obvious that the gate shown in FIG. 8 is an (n−1) complementer.

FIG. 8 shows a base n circuit (n>2) with vertical broken lines in each of the ILD, CS, and OLG portions so that any number of elements up to k may be included, where k=n−1. For example, if k=4, then the circuit will operate in base 5 (there being 4 such elements shown for each of the ILD, CS, and OLG portions).

While the DTD gate is simple, it has several limitations. Firstly, if offers a low immunity to noise, because the amplitude between its two successive logic level is about 0.7 V. Secondly, the propagation delay increases as the input logic level is higher, because the input detector diodes are in series (from the point of view of current path).

These two limitations can be overcome by the use of the following ZTZ gate.

ZENER-TRANSISTOR-ZENER (ZTZ) CIRCUIT

Figure 9:
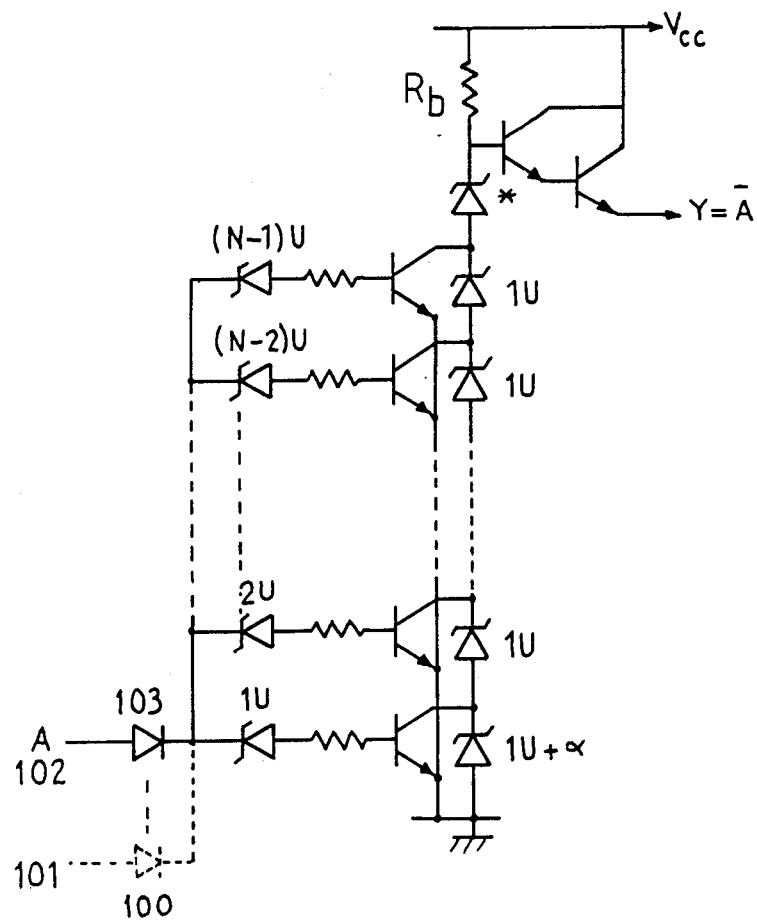
FIG. 9 illustrates a further type 1 circuit utilizing Zener-diodes and transistors.

The ZTZ circuit implementing a basic MLL gate is shown in FIG. 9. Its functional parts can be identified as follows:

(a) the ILD is a set of "Z-$R_b$-BE in series",
(b) the CS is a set of "CE" switches, and
(c) the OLG is formed by a series of zener diodes, where:
   z=zener diodes
   $R_b$=base resistor of a transistor
   BE=base-emitter
   CE=collector-emitter Its logic levels are defined as shown in FIG. 10(a) where, in this case;
   $A_1 = V_z$ of zener+$_{be(sat)}$ of transistor and
   $U = V_z$ of zener diode=any desired value.

Its characteristic function is shown in FIG. 10(b). Thus the ZTZ gate whose circuit is shown in FIG. 9 is another (n−1) complementer gate. The operation of circuit shown in FIG. 9 is similar to that of the one shown in FIG. 8. It is a more general version, in the sense that its logic unit or 1U can be defined to any desired voltage value.

A $\overline{\text{MAXIMUM}}$ GATE (or $\overline{\text{NOR}}$ IN BASE N)

By adding one or more dotted diode 100 to the input of the gate shown in FIG. 9 (or FIG. 8), a complementary maximum gate or $\overline{\text{MAX}}$ gate can be obtained. With reference to FIG. 9, a $\overline{\text{MAX}}$ gate has input lines 101 and 102 leading to an ILD having (n−1) zener diodes in parallel. Either diode 100 or 103 will conduct depending upon which receives the higher input logic level.

If line 101 is presented with a logic level of unit 2 and line 102 is presented with a logic level of unit 8 and the circuit operates in base 10, then line 102 and diode 103 will conduct to switch on the first 8 zener diodes 1u to (n−2)u, (remembering that n=10).

For base 10 operation, there will be 9 zener diodes forming the ILD, 9 transistors forming the CS, and 9 zener diodes (at the right of FIG. 9) forming the OLG. The transistor corresponding to zener 8 will be switched on to by-pass the lower 8 output zener diodes so that an output logic level Y of 1 unit is achieved. This is the (n−1) complement (in this case the 9's complement) of the highest input (8 units) presented to the gate. Similarly, the gate could have any number of multi-level input lines.

COMBINATIONAL CIRCUITS

By properly combining some COMPLEMENTER and MAX gates, almost all (if not all) gates and circuits developed in the binary system can also be realized in an n-ary system. Only a few of these gates and circuits are presented by way of example.

Figure 11:
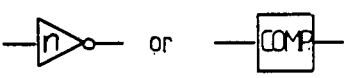
FIG. 11 is a table illustrating 5 gates, 3 of which can be derived from the first two multi-level logic gates.
Figure 11:
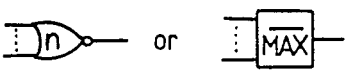
Figure 11:
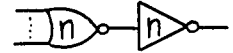
Figure 11:
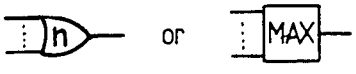
Figure 11:
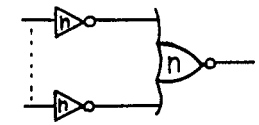
Figure 11:
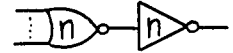
Figure 11:
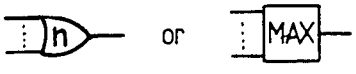
Figure 11:
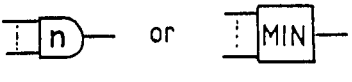
Figure 11:
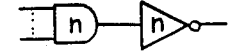
Figure 11:
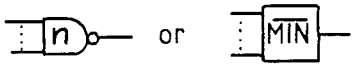

FIG. 11 shows 5 fundamental gates, 3 of which are derived from the first two, where the letter "n" inside each gate symbol signifies that the gate is in base n or an n-ary gate. As these correspond to binary gates their operation will be readily understood by those skilled in the art.

Figure 12:
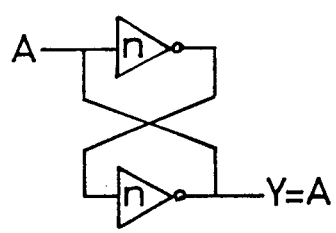
FIG. 12A is a basic memory latch, in base n.
FIG. 12B is a multi-level clocked D-flip flop.
FIG. 12C is a multi-level master-slave clocked D-flip flop.
Figure 12:
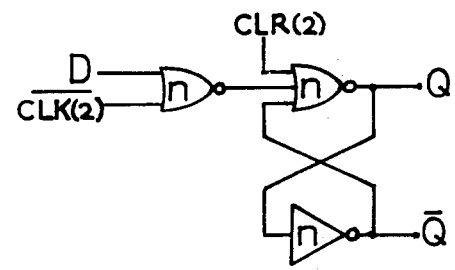
Figure 12:
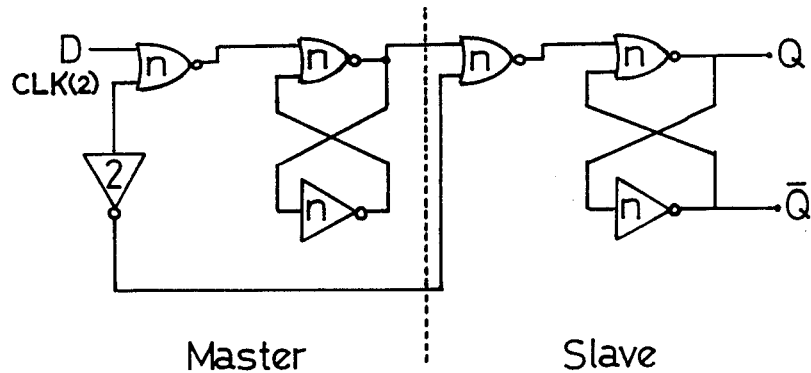

FIGS. 12(a), (b) and (c) show the base n "basic latch" or "basic memory cell (BMC)", "clocked D-Flip Flop" and a "master-slave D-Flip Flop" respectively.

Figure 13:
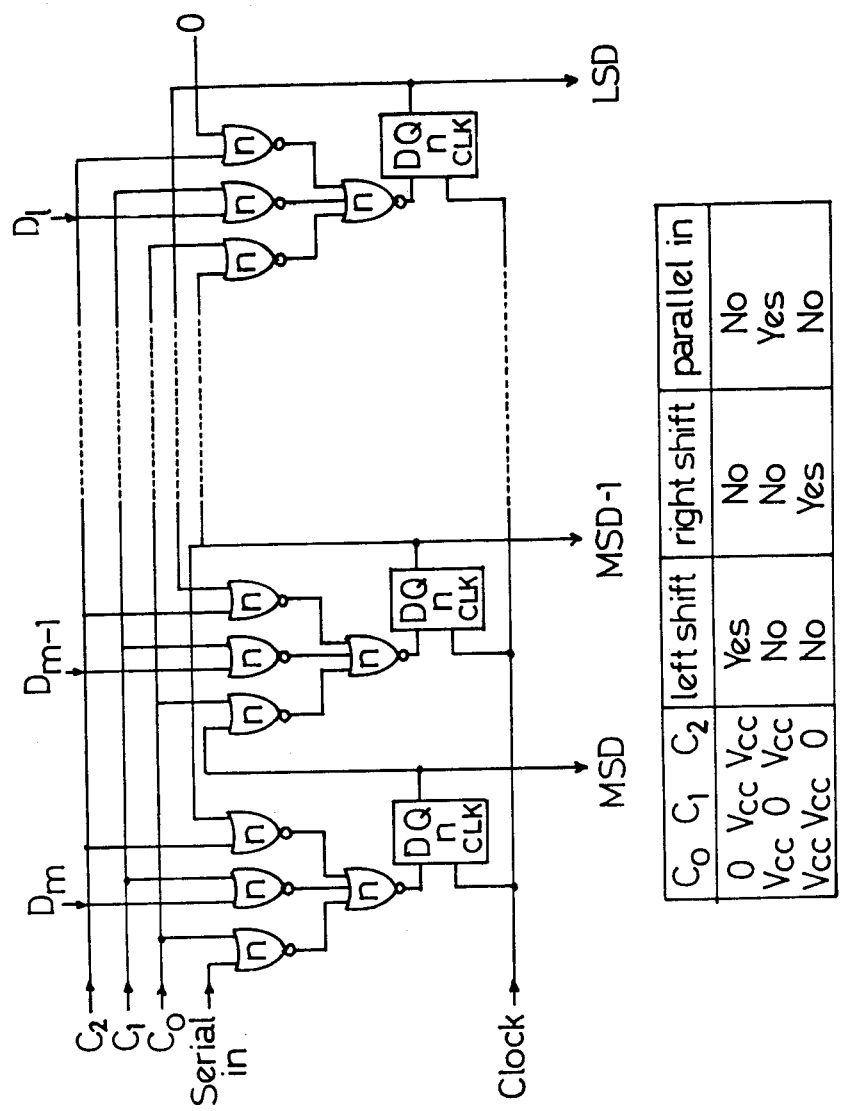
FIG. 13 is a multi-level left/right shift register with a serial/parallel input.

FIG. 13 illustrates a circuit of an n-ary left/right shift register with serial/parallel input.

TYPE 2 MLL CIRCUITS

Following from the circuit structure shown in FIG. 5, any binary relation between two 1 digit numbers (in base n) can be electronically devised. For example, the least significant digit (LSD) as well as the most significant digit (MSD) of AXB can be implemented in any base.

Figure 14A:
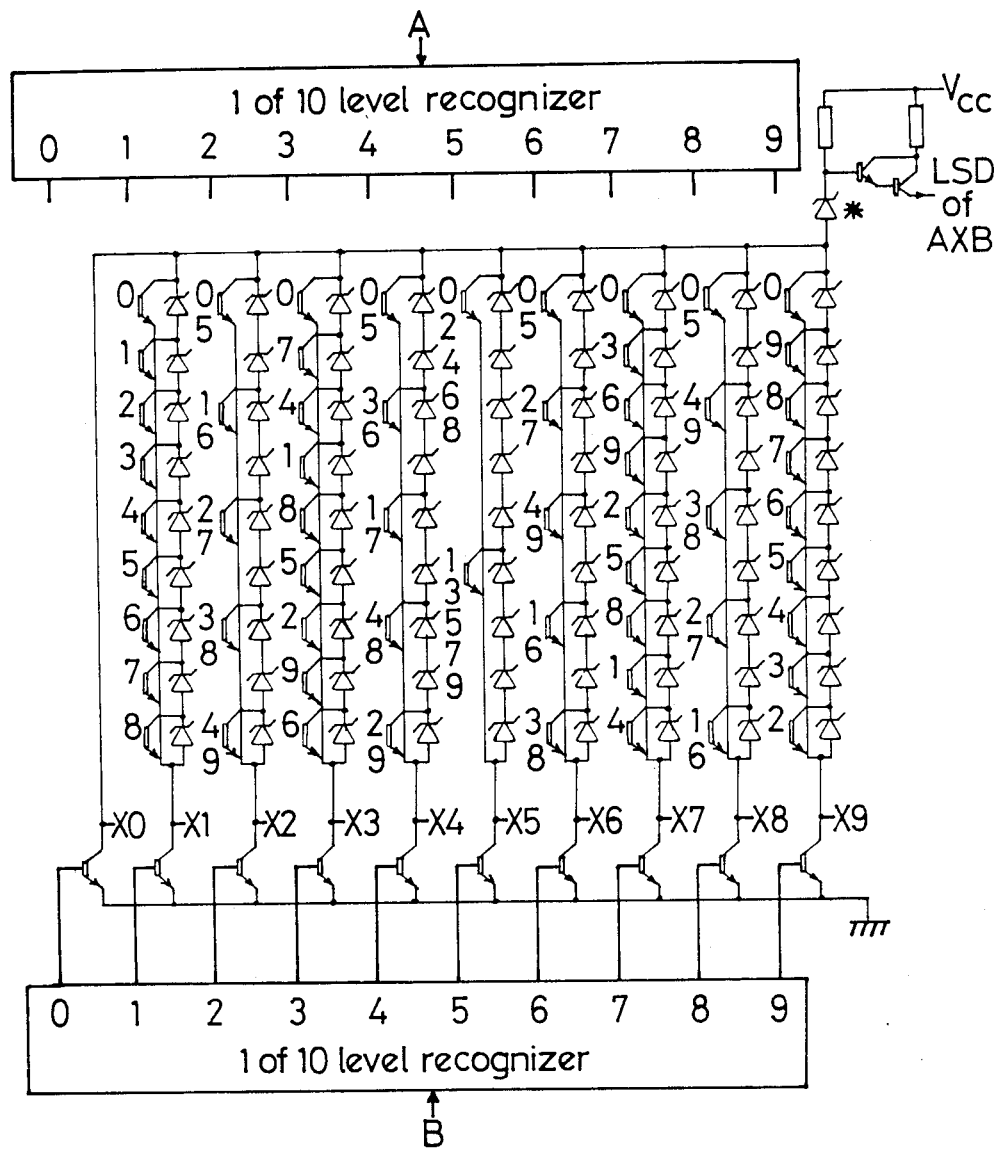
FIG. 14 is an electronic embodiment of a base 10 1-digit full multiplier.
Figure 14B:
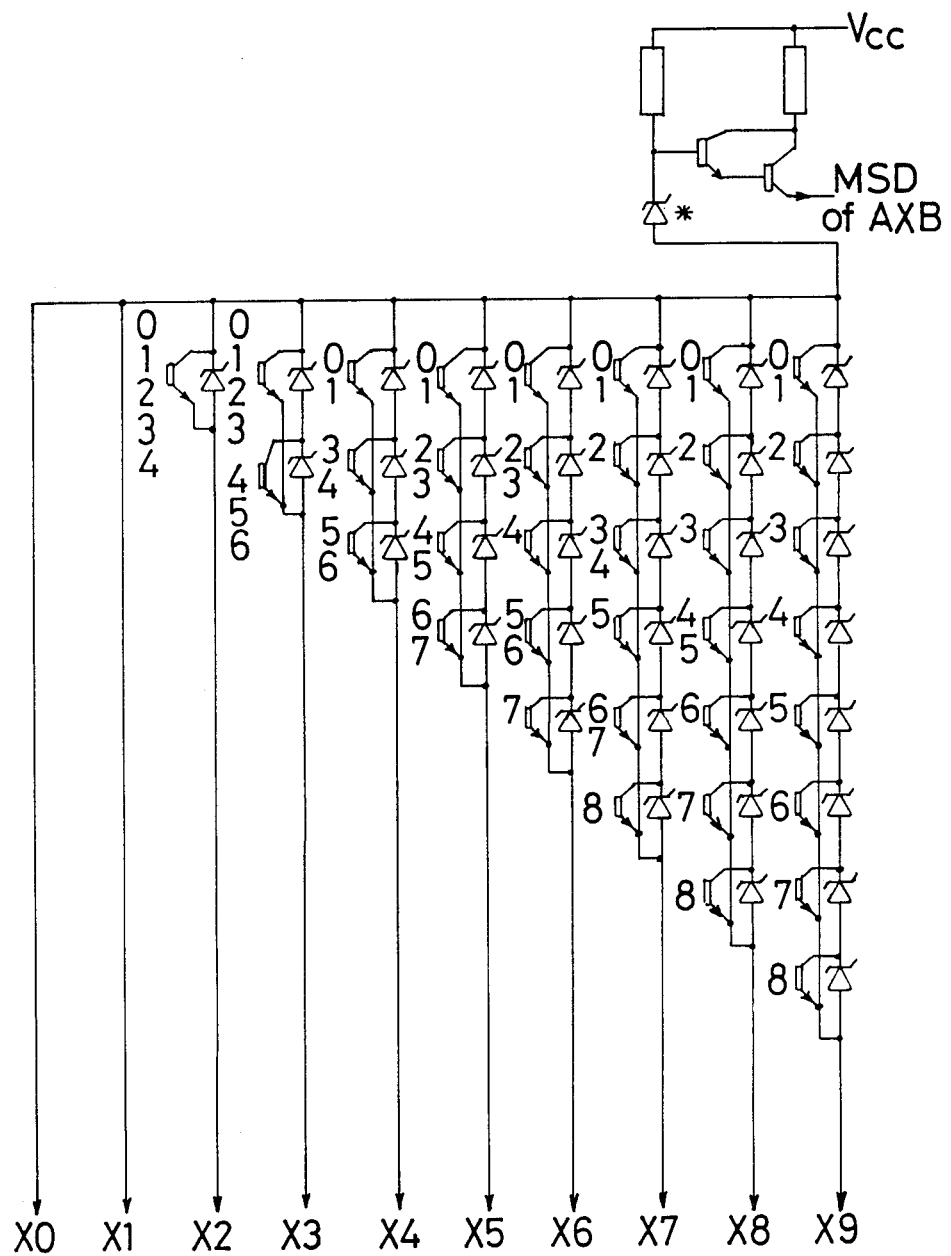

Without any loss of its generality, FIG. 14 shows a circuit of a base 10 1-digit full multiplier. The circuit makes use of FIG. 5 twice: the first for the LSD of AXB and the second for the MSD of AXB.

The circuit structure shown in FIG. 5 can also be used where multiple unary relations are to be performed using one single output line.

FIG. 14 can be broken down into two circuits. The portion on the left produces an output of the least significant digit (LSD) of A×B, While the portion on the right produces the most significant digit (MSD) of A×B.

The circuit has 2 ILD's each of which is in the form of a 1 of n LLR capable of receiving a multi-level input A or B. The B ILD has n (in this case 10) binary outputs each of which is connected to a column enabling switch. Each column includes a combination of CS and OLG (other than the zero column which has a zero OLG and hence no CS).

The outputs from the A ILD are connected to different control switches of the control switching means (CS) of each of the columns.

Similarly the MSD circuit consists of columns of CS and OLG fed from two ILD's.

For example, the multiplication of 5×7 (in base 10) can utilise an input of logic 5 at A and logic 7 at B. Starting from the B ILD, the output is on line 7 thereby switching on column 7. For the purpose of explanation, assume that A is not yet on, then the LSD output is logic 9 (the voltage across column 7). When A is on, the A output is on line 5 of the A ILD which is connected to all of the transistors marked 5 in the different columns. In this case, only the number 5 transistor in column 7 will switch on and thus by-pass 4 units of the OLG thus providing an output of logic 5. This is the LSD output.

In the MSD circuit on the right, column 7 is also on, and the transistor No. 5 in this column is also switched on to by-pass the lower 3 units of the OLG to provide an output of 3 logic units. Thus the result is 35.

It will be noted that each column of the LSD and MSD circuits performs a unary operation on the A input.

For simplicity and cost efficiency, each half of a base 10 (general base n) 1 digit multiplier (FIG. 14) may be constructed as a type 3 MLL circuit whose ILD is a matrix of zener diodes of at most nine (n−1) different breakdown voltages.

TYPE 3 MLL CIRCUITS

Following from the circuit structure shown in FIG. 6, a 1 digit half adder/subtractor in any base can be devised.

Since the 1 digit half adder/subtractor results in only the LSD of A+B (or A−B), a carry/borrow operation is required, if a 1 digit full adder/subtractor is to be operated.

Following from FIG. 3, a carry/borrow operation can be devised by arranging the output parameter generators of the OLG in a matrix structure.

Figure 15A:
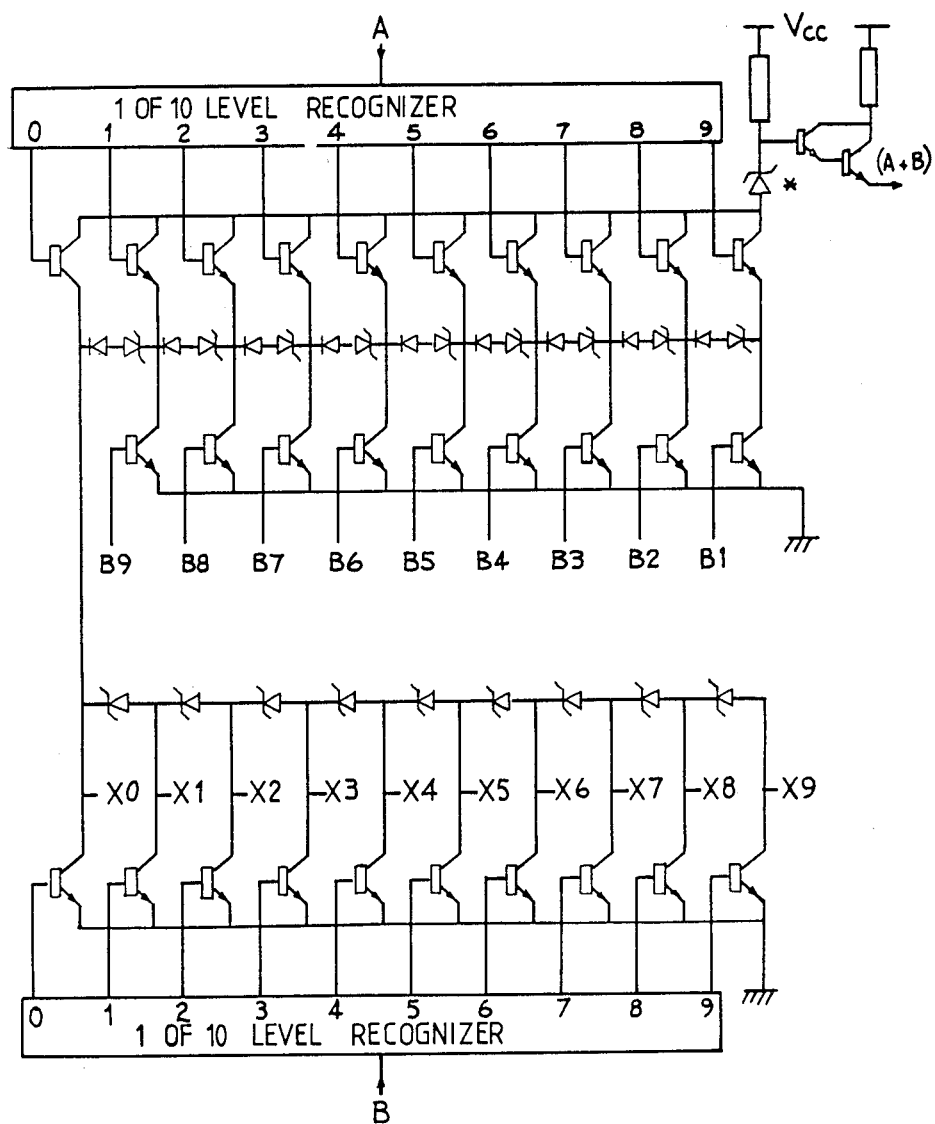
FIG. 15 is an electronic embodiment of a base 10 1-digit full adder.
Figure 15B:
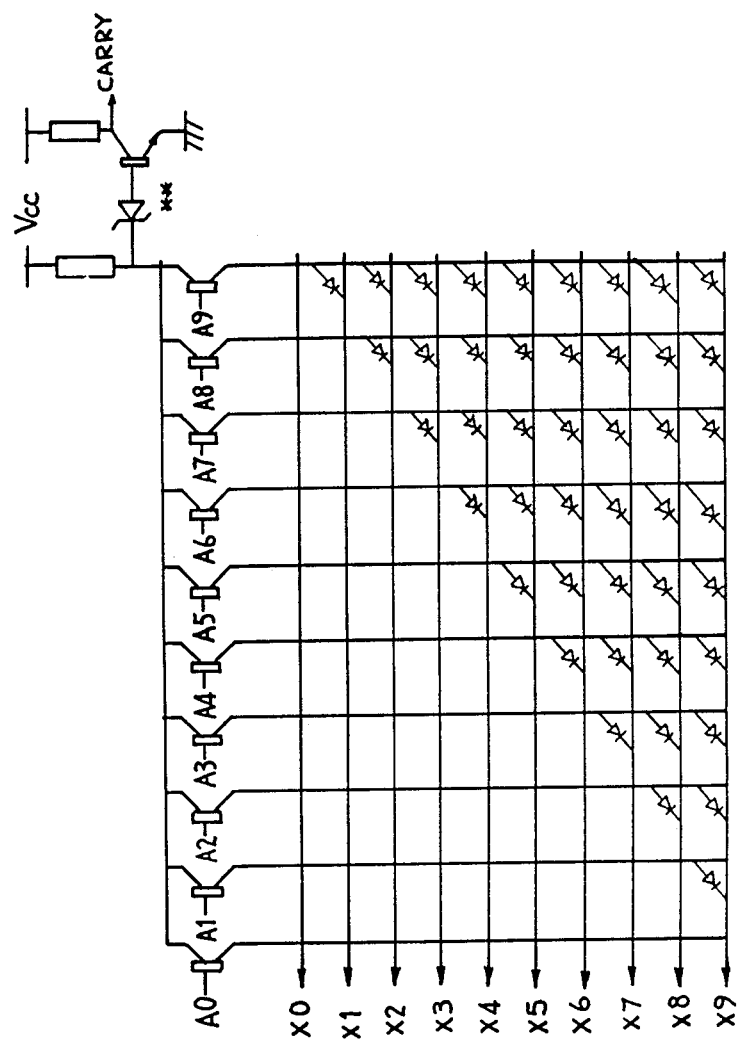
Figure 16A:
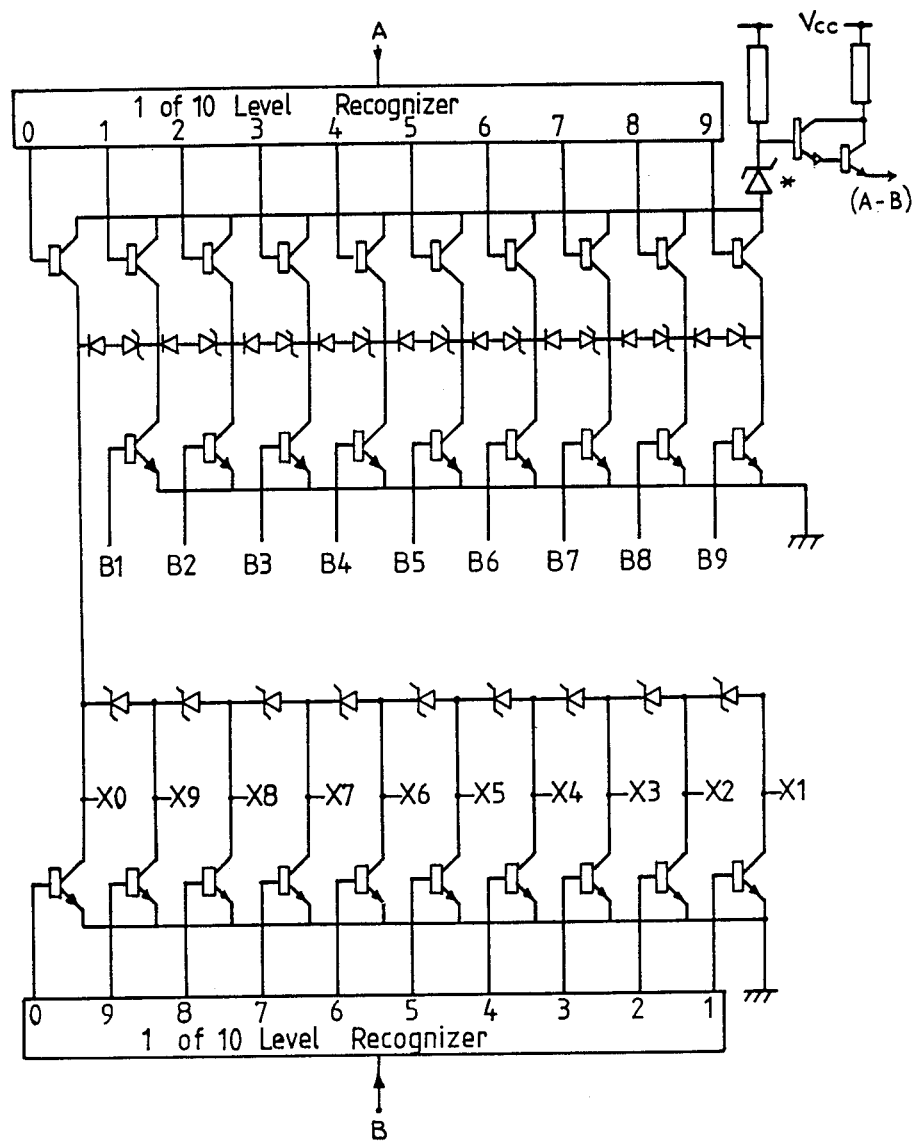
FIG. 16 is an electronic embodiment of a base 10 1-digit full subtractor.
Figure 16B:
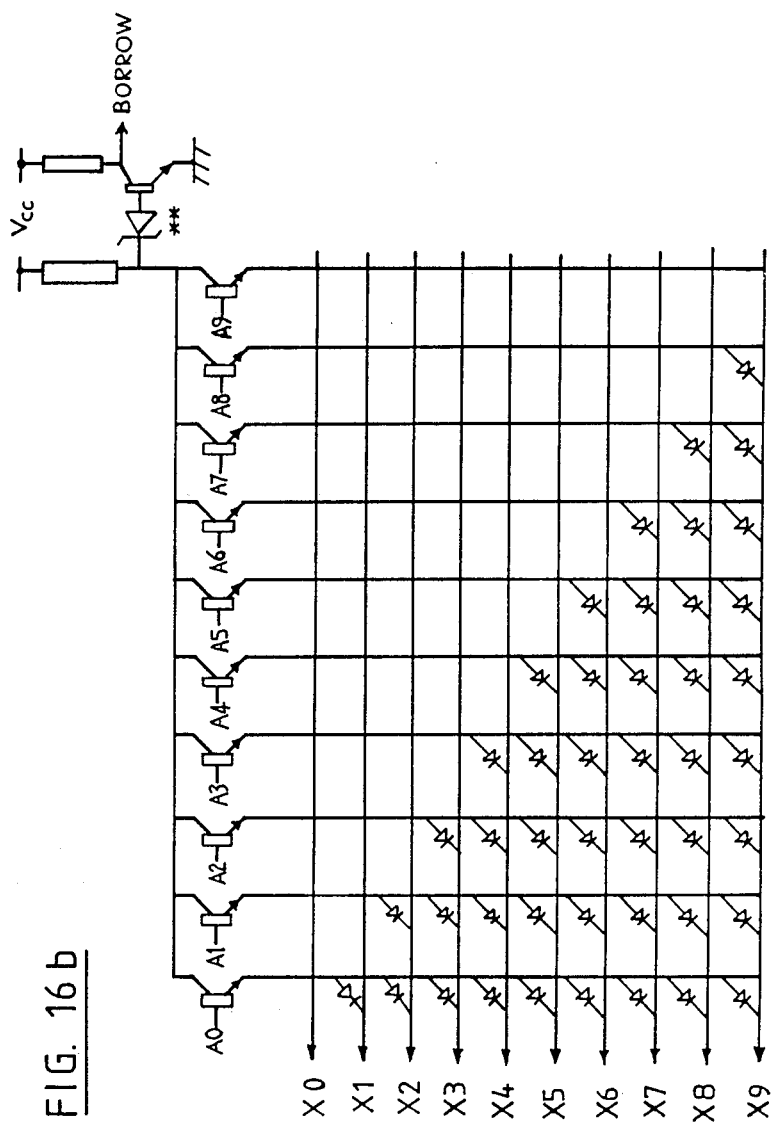

Without loss of their generality FIGS. 15 and 16 illustrate a circuit of a base 10 1 digit full adder and a circuit of a base 10 1 digit full subtractor respectively.

FIG. 15 is an addition circuit having 2 ILDs along a pathway between the supply and ground. The outputs from the ILDs are connected to switches along this pathway so that the output from the B ILD can be used to select the ground level at a particular point along the OLG. The output from A ILD can be used to connect the supply to a particular point along the upper half of the OLG.

The right hand circuit of FIG. 15 shows a carry operation similar to a binary matrix encoder/decoder.

For example, the addition of 7+8 can involve an input of 7 at B and input of 8 at A. The B ILD output on line 7 switches ON its transistor to bring the X7 point to ground. At the same time the B7 transistor is switched ON which takes priority over the X7 point.

The A ILD output on line 8 switches ON its transistor which connects the supply to the OLG at 1 unit removed from the top end of the OLG. Thus the output is 5 logic units being the voltage between ground at the collector of transistor B7 to the supply at the point 1 unit from the top end of the OLG.

The X 7 line of the carry circuit is at ground and when the A 8 transistor is ON, the diode bridging the A 8 and B 7 lines will conduct thus turning OFF the carry transistor to give a carry output of supply voltage Vcc which is denoted as carry 1.

The subtraction circuit of FIG. 16 is similar, and its operation will be apparent to those skilled in the art.

A 1 of n LLR

Figure 17:
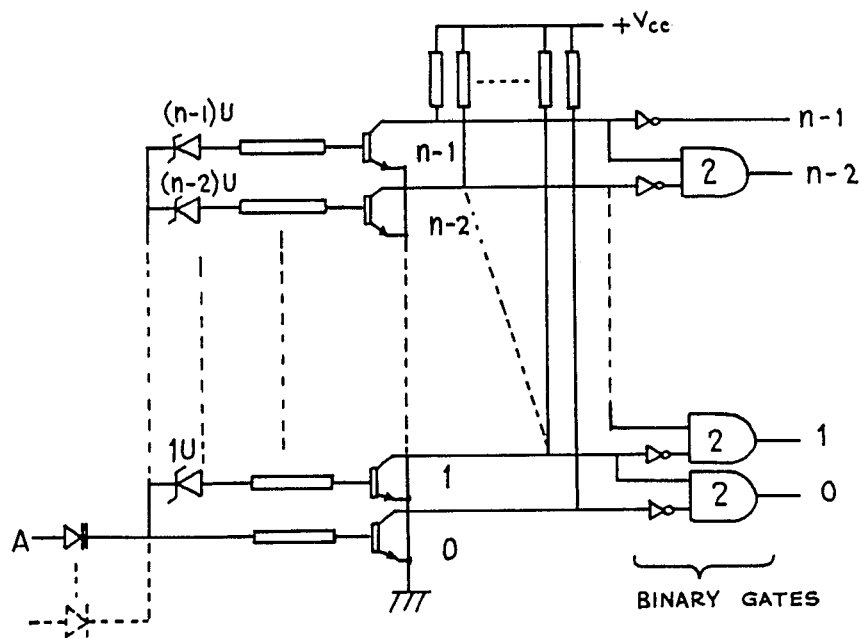
FIG. 17 is an electronic circuit illustrating a "1 of n logic level recognizer".

FIG. 17 shows an ILD which functions as a 1 of n LLR and is suitable for the circuits of FIGS. 14–16. It has a multi-level input A, n transistors, n binary inverters, and (n−1) binary AND gates, with n binary outputs of which only one can be activated at a time.

This enables a logic input in base n (n>2) to be converted to a binary output on any one of n output lines. If this circuit is to operate to convert base 10 signals to binary, then 9 zener diodes will be required for the ILD.

For example an input of logic 0 will cause the 0 transistor to switch ON thereby giving a high input to the lower line of the 0 AND gate (wherein the digit 2 within the AND gates indicate that they are binary AND gates), this high input being the inversion of the low output from the 0 transistor, is combined with a high input on the upper line of this gate and thus gives a binary logic 1 (high) on the 0 output line. Thus if logic level 0 of a multi-level input reaches the input A, then the binary output line 0 will be activated.

Generally, a multi-level input of logic k, say, will activate corresponding binary output line k. Consider an input of logic 1 reaching input A, this will switch ON both the 0 and logic 1 transistors. The 0 transistor will conduct because the logic 1 voltage is higher than the input diode, while the logic 1 transistor will conduct as the logic 1 voltage is sufficient to switch ON the logic 1 zener-diode. The AND gate on the 0 output will now receive a high input on its lower line (being the low output from 0 transistor inverted by the inverter gate on this line). The upper line of this 0 AND gate receives a low input as the logic 1 transistor is switched ON. Thus the combination of a low and high inputs to the logic 0 gate will result in a low or zero output on line 0. However, the logic 1 AND gate receives a high input on both lines and thus produces a binary output of logic 1 on output line 1. It will thus be apparent that only one binary output corresponding to the logic level of the input will be activated.

It will be appreciated that the invention teaches how to construct circuits operating in a desired base. Although some of the examples have been given with reference to base 10, the invention is capable of exploitation in whatever base is required for a particular circuit. It may for example be desirable to produce circuits operating in base 16 or some other power of 2. It will be noted from FIG. 11 that the majority of basic gates, and from FIG. 12 basic memory cells can be derived from the basic multi-level complementer, and the multi-level complementary maximum gates described in FIG. 9. The circuit of FIG. 9 is only one example of how the invention may be implemented, and many other examples will be apparent to those skilled in the art. The invention thus provides rules and guidelines by which multi-level logic circuits of varying degrees of complexity can be constructed from the basic building blocks being basic multi-level gates and basic multi-level binary operators.

Finally, it will be appreciated that various alterations or modifications may be made to the foregoing without departing from the scope of this invention as exemplified by the following claims.

I claim:

1. A multi-level logic circuit operating in a base n where n is greater than 2, comprising
   (a) first logic circuit means including
     (1) a first input level detector having one multi-level detector for detecting any one of n logic levels and for producing a first output signal in response to an appropriate input logic level;
     (2) a first control switching device connected with said first input level detector for producing a first select signal in response to the output signal from said first level detector; and
     (3) a first output level generator connected with said first control switching device for producing in response to said first selected signal an output of logic level (n−1−a), wherein a is the input logic level detected by said first input level detector; and
   (b) second logic circuit means including
     (1) a second input level detector having a plurality of multi-level input lines arranged so that the highest logic level on one of said input lines is transmitted to the second input level detector which produces a second output signal in response to the highest logic level;
     (2) a second control switching device connected with said second input level detector for producing a second selected signal in response to said second output signal; and
     (3) a second output level generator connected with said second control switching device for producing in response to said second select signal an output of logic level $(n-1-a_x)$, where $a_x$ is the highest logic level of the input logic levels ($a_1$, $a_2$, $a_3 \ldots a_k$) detected by said second input level detector;
     said first and second input level detectors each including voltage dependent input switching means, respectively, and said first and second output level generators each including a voltage divider capable of providing n different voltage outputs, respectively.

2. Apparatus as defined in claim 1, wherein each control switching device includes (n−1) switching elements and each voltage divider comprises corresponding (n−1) logic units, each of which is capable of being by-passed by the associated switching element of said control switching device.

3. A multi-level logic circuit operating in a base n where n is greater than 2, comprising
   (a) a first input level detector for detecting a first input logic level and for producing a first output signal in response to an appropriate input logic level;
   (b) a second input level detector for detecting a second input logic level and for producing a second output signal n response to an appropriate input logic level;
   (c) control switching means connected with said first and second input level detectors for producing first and second select signals in response to the first and second output signals; and
   (d) output level generator means connected with said control switching means for producing a logic output in accordance with said first and second select signals, whereby a binary operation on said two input logic levels is performed resulting in a single multi-level output;
   said first and second input level detectors each comprising a one of n logic level recognizer having n outputs, respectively, the n outputs of a first logic level recognizer being used to switch a respective control switch which in turn by-passes a portion of said output level generator means, the n outputs of the second logic level recognizer being used to activate a further control switch connecting a supply to a particular point of the output level generator, whereby the combined operation of the two input level detectors enables said output operation on said two inputs.

4. Apparatus as defined in claim 3, wherein said first and second input level detectors each comprise a one of n logic level recognizer having n outputs, respectively, the n outputs of a first logic level recognizer being connected to respective enabling switches capable of selecting a particular combined network of control switching means and said output level generator means, the n outputs of the second logic level recognizer being capable of controlling the control switching means of the selected network.

5. Apparatus as defined in claim 3, wherein each input level detector includes voltage dependent input switching means.

6. Apparatus as defined in claim 5, wherein said output level generator includes a voltage divider capable of providing n different voltage outputs.

7. Apparatus as defined in claim 5, wherein said output level generator includes a matrix of voltage level generators.

* * * * *